United States Patent [19]

Sasaki

[11] Patent Number: 5,366,907
[45] Date of Patent: Nov. 22, 1994

[54] METHOD OF FABRICATING A BI-CMOS INTEGRATED CIRCUIT DEVICE

[75] Inventor: Masakazu Sasaki, Tokyo, Japan

[73] Assignee: NEC Corporation, Tokyo, Japan

[21] Appl. No.: 24,730

[22] Filed: Feb. 26, 1993

[30] Foreign Application Priority Data

Feb. 26, 1992 [JP] Japan ................................ 4-075436

[51] Int. Cl.$^5$ ........................................ H01L 21/265
[52] U.S. Cl. .......................................... 437/34; 437/31;
 437/164; 437/59; 148/DIG. 9
[58] Field of Search .................. 437/31, 59, 162, 193,
 437/195, 228, 34, 32, 228, 909; 148/DIG. 9,
 DIG. 10, DIG. 11, DIG. 124

[56] References Cited

U.S. PATENT DOCUMENTS

| | | | |
|---|---|---|---|
| 5,059,549 | 10/1991 | Furuhata | 437/59 |
| 5,094,964 | 3/1992 | Hamasaki | 437/31 |
| 5,096,843 | 3/1992 | Kodaira | 437/34 |
| 5,171,702 | 12/1992 | Prengle et al. | 437/59 |
| 5,320,971 | 6/1994 | Eklund et al. | 437/31 |

OTHER PUBLICATIONS

"A High-Performance BICMOS Technology with Double-Polysilicon Self-Aligned Bipolar Devices", *IEEE*, 1987, vol. EDL-S, No. II, by K. Rajkanan et al., pp. 509–511.

*Primary Examiner*—Brian E. Hearn
*Assistant Examiner*—Tuan Nguyen
*Attorney, Agent, or Firm*—Young & Thompson

[57] ABSTRACT

The invention provides a novel method of fabricating a semiconductor integrated circuit device involving a bipolar transistor having a collector contact with sidewall oxide films. After forming an active base region, an oxide film is formed on an entire surface of the device by a vapor phase growth method. An anisotropic etching of the oxide film is accomplished by using a photoresist pattern so that the oxide film remains both on the active base region and at opposite side portions of the collector contact. Alternatively, the oxide film remains not only on the active base region but also over and in the vicinity of the collector contact. The active base region is free from any damage such as etching and crystal defects caused by the anisotropic etching, as being covered with the remaining oxide film. A graft base region is formed by ion-implantation with using the above remaining oxide film as a mask. An edge portion of the remaining oxide film exists directly over a boundary line between the active base region and the graft base region.

10 Claims, 9 Drawing Sheets

METHOD OF FABRICATING A BI-CMOS INTEGRATED CIRCUIT DEVICE

BACKGROUND OF THE INVENTION

The invention relates to a semiconductor integrated circuit device, and more particularly to a bipolar complementary metal oxide semiconductor (Bi-CMOS) integrated circuit device and a method of fabricating the same.

The Bi-CMOS integrated circuit device includes a bipolar transistor and a complementary metal oxide field effect transistor (CMOS), both of which are formed in a single semiconductor substrate. The complementary metal oxide field effect transistor (CMOS) comprises a pair of an n-channel type metal oxide field effect transistor (n-MOS) and a p-channel type metal oxide field effect transistor (p-MOS). In general, a bipolar transistor has a superior property in high frequency and high speed performances. In contrast, a CMOS transistor has a superior property in a low power consumption. The bipolar-CMOS integrate circuit device is so designed that the bipolar transistor and the CMOS transistor are respectively formed on a signal semiconductor substrate. This permits the bipolar-CMOS integrated circuit device to exhibit both a high frequency performance property possessed by the bipolar trnasistor and a low power consumption property possessed by the CMOS transistor. Namely, the bipolar-CMOS integrated circuit device possesses such respective superior properties of the bipolar transistor and the COMS transistor.

Further, in view of reduction of fabrication processes of the bipolar CMOS integrated circuit device, it is required to fabricate the bipolar transistor and the CMOS transistor in the same process.

FIG. 1 illustrates a structure of the conventional bipolar-CMOS integrated circuit device in which a p-channel MOS transistor and an n-p-n bipolar transistor only are illustrated and thus an illustration of an n-channel MOS transistor is omitted. Previous to a description of fabrication processes, the structure of the conventional bipolar-CMOS integrated circuit device will be described with reference to FIG. 1.

The bipolar-CMOS integrated circuit device has a semiconductor substrate 1. A p-channel type MOS transistor region 10C, an n-p-n bipolar transistor region 101 and a resistive region 102 are formed on the semiconductor substrate. A plurality of n-type buried layers 2 doped with an n-type dopant are formed on the semiconductor substrate 1 in each of the p-channel type MOS transistor region 100, the bipolar transistor region 101 and the resistive region 102. Further, a p-type buried layer 3 doped with a p-type dopant is formed on the semiconductor substrate 1 at boundary areas between the p-channel MOS transistor region 100 and the bipolar transistor region 101 and between the bipolar transistor region 101 and the resistive region 102. An n-type epitaxial layer 4 is formed on the n-type buried layer 2 in the bipolar transistor region 101. An n-type well region 6 is formed on the n-type buried layer 2 in the p-channel MOS transistor region 100. A p-type well region 5 is formed on the p-type buried layer 3 at the boundary area between the p-channel MOS transistor region 100 and the bipolar transistor region 101. Further, a chennel stopper 7 is formed on the p-type well region 100 at the boundary area between the p-channel MOS transistor region 100 and the bipolar transistor region 101. Furthermore, field oxide films 8 serving as isolation films are formed on the channel stopper 7 to isolate between the p-channel MOS transistor region 100 and the bipolar transistor region 101.

In the p-channel MOS transistor region 100, source and drain regions doped with a p-type dopant are formed at upper portions of the n-type well region 6 thereby defining p-type channel region. A gate oxide film is formed on the channel region. A gate contact is formed on the gate oxide film. Side-wall oxide films are formed at opposite side portions of the gate contact 11. A first inter-layer insulator is formed on the entire surface of the device. A second inter-layer insulator 20 is further formed on the first inter-layer insulator 19. Source and drain contacts 24-1 and 24-2 are so formed as to be in contact with the source and drain regions respectively.

In the bipolar transistor region 101, an $n^+$-type low resistive buried layer is formed directly under a collector contact region. A collector contact 24-5 is formed on the $n^+$-type low resistive buried layer. The existence of the $n^+$-type low resistive buried layer makes a collector resistance reduced as its high dopant concentration thereby permitting the bipolar transistor to exhibit a high frequency property. Side-wall oxide films are formed at opposite side portions of the collector contact 24-5. A p-type base region and a graft base region are formed at upper portions of the n-type epitaxial layer 4. A base contact 24-3 is so formed as to be in contact with the graft base region. An emitter region is formed in an upper portion of the base region. An emitter contact 24-4 is so formed as to be in contact with the emitter region. A device performance depends upon the active base region but for the graft base region. The graft base region has a higher dopant concentration than a dopant concentration of the active base region as being independent from a device performance, thereby making a base resistance reduced.

The conventional fabrication processes of the bipolar-CMOS integrated circuit device will be described in reference to FIGS. 1 and 2A to 2D.

The semiconductor substrate 1 is prepared, after which n-type buried layers 2 doped with an n-type dopant are formed by a normal process on the semiconductor substrate 1 in each of the p-channel type MOS transistor region 100, the bipolar transistor region 101 and the resistive region 102. Further, the p-type buried layer 3 doped with a p-type dopant is formed by a normal process on the semiconductor substrate 1. The n-type epitaxial layer 4 is formed by a normal process on the n-type buried layer 2 in the bipolar transistor region 101. The n-type well region 6 is formed on the n-type buried layer 2 in the p-channel MOS transistor region 100. A p-type well region 5 is formed on the p-type buried layer 3. Further, the channel stopper 7 is formed on the p-type well region 100. Furthermore, field oxide films 8 serving as isolation films are formed on the channel stopper 7 to isolate between the p-channel MOS transistor region 100 and the bipolar transistor region 101. Subsequently, as illustrated in FIG. 2A, a thin oxide film 9 having a thickness in the range from 150 angstroms to 400 angstroms is formed on each of the p-channel MOS transistor region 100. the bipolar transistor region 101 and the resistive region 102, in addition to a collector contact region 10. The above processes are normal processes which are well known in the art.

As illustrated in FIG. 2B, after removing selectively a portion of the thin oxide film 9 in the collector contact region 10, a polycrystalline silicon film doped with an n-type dopant at a high dopant concentration is so selectively formed as to remain at a gate contact region and a collector contact region 10. A portion of the polycrystalline silicon film remaining in the collector contact region 10 is in contact with the n+-type buried layer 13 thereby resulting in a formation of the collector contact 12. In contrast, a portion of the polycrystalline silicon film remaining in the gate contact region serves as a gate contact 11.

As shown in FIG. 2C, a selective ion-implantation of an n-type dopant into an n-channel MOS transistor region is accomplished at a dopant concentration in the range from $1 \times 10^{17}$ atoms/cm$^3$ to $5 \times 10^{18}$ atoms/cm$^3$. Also, a selective ion-implantation of but a p-type dopant into the p-channel MOS transistor region 100 is accomplished at a dopant concentration in the range from $5 \times 10^{17}$ atoms/cm$^3$ to $2 \times 10^{18}$ atoms/cm$^3$. As a result, p-type source and drain regions 14-1 and 14-2 having a relatively low dopant concentration are formed in the p-channel MOS transistor region 100 thereby defining the channel region under the gate contact 11. Further, the p-type base region 15 having a relatively low dopant concentration is formed in the bipolar transistor region 101. Furthermore, the p-type resistive region 25 are formed in the resistive region 102.

A vapor phase growth oxide film having a thickness in the range from 100 nanometers to 300 nanometers is formed on an entire surface of the device. After that, an anisotropic etching to the vapor phase growth oxide film is accomplished by using a gas such as CF$_4$ so that the vapor phase growth oxide film remains at only opposite side portions of each of the gate contact 11 and the collector contact 12. As a result, side-wall oxide films 16 are formed at opposite side portions of each of the gate contact 11 and the collector contact 12 respectively.

In addition, a selective ion-implantation of an n-type dopant into the n-channel MOS transistor region is accomplished at a dopant concentration of approximately $1 \times 10^{20}$ atoms/cm$^3$. Also, a selective ion-implantation of but a p-type dopant into the p-channel MOS transistor region 100 is accomplished at a dopant concentration in the range from $1 \times 10^{19}$ atoms/cm$^3$ to $2 \times 10^{20}$ atoms/cm$^3$. As a result, p-type source and drain regions 17-1 and 17-2 having a relatively high dopant concentration are formed in the p-channel MOS transistor region 100. Further, the p-type graft base region 18 having a relatively high dopant concentration is formed in the bipolar transistor region 101. Furthermore, a p-type low resistive portions 26 are formed in the resistive region 102.

Subsequently, as illustrated in FIG. 2D, the first inter-layer insulator 19 having a thickness in the range from 150 nanometers to 300 nanometers is formed by a vapor phase growth method on an entire surface of the device. After that, an opening as selectively formed on the first inter-layer insulator 19 over the base region 15. A second polycrystalline silicon film doped with an n-type dopant is selectively formed in the vicinity of the opening so as to be in contact with the p-type base region 15, followed by a diffusion of the n-type dopant from the second polycrystalline silicon film into the base region. As a result, the n-type emitter region 21 is formed at an upper portion of the base region 15.

As shown in FIG. 1, a second inter-layer insulator 22 having a thickness in the range from 300 nanometers to 700 nanometers is formed on an entire surface of the device, followed by a selective formation of openings. Further, a metal film made of a metal having a low conductivity such as aluminium is so formed on the second inter-layer insulator 22 as to cover the openings formed in the second inter-layer insulator 22. Namely, the openings formed in the second inter-layer insulator 22 are respectively filled with the metal film. The metal film is so patterned as to remain in the vicinity of the respective openings. The remaining portions of the metal film serve as respective contacts, and thus the source and drain contacts 24-1 and 24-2 in the p-channel MOS transistor region 100 and the base, emitter and collector contacts 24-3, 24-4 and 24-5 in the bipolar transistor region 101, in addition contacts in the resistive region 102. The bipolar-CMOS integrated circuit device has been formed by such processes.

The conventional bipolar-CMOS integrated circuit device is, however, engaged with the following disadvantages, which will be described in detail.

As described above, in the process illustrated in FIG. 2B, the vapor phase growth oxide film was formed on the entire surface of the device, followed by the anisotropic etching of the vapor phase growth film. As a result, the vapor phase growth oxide film remains at only opposite side portions of each of the gate contact 11 and the collector contact 12. In this process, the bipolar transistor region 101 is also subjected to the anisotropic etching. The anisotropic etching process provides a damage to the active base region 15. The anisotropic etching process also causes crystal defects to be generated in the active base region 15. In such a case, the emitter region 21 is forced to overlay such base region 15 having a damage or crystal defects. The existence of the damaged portion or the crystal defects makes an emitter-base junction exhibit the short-circuit. This makes a yield of the device reduced.

To combat of the above disadvantages, the following method has been proposed. In the process illustrated in FIG. 2B, after forming the vapor phase growth oxide film on the entire surface of the device, a photo-resist 27-2 is provided so selectively as to exist over the emitter region by using a photo-lithography as illustrated in FIG. 3A. After that, the anisotropic etching to the vapor phase growth oxide film is accomplished to form the side-wall oxide films 16. Thus, the photo-resist 27-2 which covers a portion of the active base region 15 is able to keep the covered portion of the active base region 15 from suffering any damage provided by the the anisotropic etching process. A portion of the active base region which is not covered with the photo-resist 27-2, however, suffers any damage provided by the anisotropic etching to the vapor phase growth oxide film. The existence of the photo-resist 27-2 prevents crystal defects to be caused in the active base region 15. This makes the emitter-base junction free from the short-circuit.

After the anisotropic etching process, the vapor phase growth oxide film remains at a portion which is covered with the photo-resist 27-2. Then, an ion-implantation of an n-type dopant into the n-channel MOS region is accomplished at a high dopant concentration.

As illustrated in FIG. 3B, the photo-resist 27-2 is removed, after which a photo-resist 27-3 is so selectively provided as to cover the remaining portion of the vapor phase growth oxide film. The photo-resist 27-3 also covers an exposed portion of the active base region 15, but for a region in which the graft base region 18 will be formed. Further, in the resistive region, a photo-resist is so selectively as to cover the p-type resistive region 25, but for the low resistive portions 26. A selective ion-implantation of a p-type dopant into the p-channel MOS transistor region is accomplished at a high dopant concentration by using the photo-resist 27-3 as a mask. As a result, the graft base region 18 having a high dopant concentration is formed at the portion of the base region which is not covered with the photo-resist 27-3. Thus, an edge portion of the photo-resist 27-3 defines the boundary between the graft base region 18 and the base region 15. The above ion-implantation of the p-type dopant also forms the source and drain regions 17-1 and 17-2 in the p-channel MOS transistor region 100, in addition the resistive plug portions 26 in the resistive region 102.

As shown in FIG. 3C, after removing the photo-resist 27-3, the first inter-layer insulator 19 is formed on an entire surface of the device, after which an opening is selectively formed in the inter-layer insulator 19. A second polycrystalline silicon film doped with an n-type dopant is so selectively formed as to fill the opening in the first inter-layer insulator 19 thereby resulting in a formation of an emitter contact 20.

With respect to the base region 15 in the bipolar transistor region 101, as described above, the portion of the base region 15 underlying the remaining vapor phase growth oxide film 23 is free from any damage provided by the anisotropic etching as being covered with the photo-resist 27-2 in the anisotropic etching process. In contrast, a portion 28 of the base region 15 which does not underlay the remaining vapor phase growth oxide film 23, however, suffers any damage provided by the anisotropic etching. Namely, the damaged portion 28 of the base region 15 exists between the undamaged portion of the base region 15 underlying the remaining vapor phase growth oxide film 23 and the graft base region 18. The damaged portion 28 has a length in the range from 0.2 micrometers to 2.0 micrometers. A surface of the damaged portion 28 is etched by the anisotropic etching to the vapor phase growth oxide film. This makes a base resistance increased but only in the damaged portion 28 of the base region 15. The increase of the base resistance in the damaged portion 28 renders the high frequency property possessed by the bipolar transistor deteriorative considerably.

The damaged portion 28 of the active base region 15 formed in the the conventional fabrication process makes it difficult that the bipolar-CMCS integrated circuit device exhibits an excellent high frequency performance. It is therefore required to develop a novel fabrication method of the bi-CMOS integrated circuit device having a base region and an emitter region, both of which are free from any damage provided by the anisotropic etching for forming the side-wall oxide films 16.

Similarly, the resistive region 102 is also engaged with disadvantages in any damage provided by the anisotropic etching to the vapor phase growth oxide film. In the anisotropic etching process, since the p-type resistive region 25 was not covered by a photo-resist, the resistive region 25 suffers such damage that a surface of the p-type resistive region 25 is etched by the anisotropic etching. The etching of the surface of the p-type resistive region 25 makes the resistance thereof variable. The variation of the resistance possessed by the p-type resistive region 25 depends upon the magnitude of the etching of the p-type resistive region 25. The conventional fabrication method makes it difficult that the resistance of the p-type resistive region 25 possesses a high accuracy. It is also require to develop a novel fabrication method of the Bi-CMOS integrated circuit device having a resistive region being free from any damage provided by the anisotropic etching for forming the side-wall oxide films 16.

SUMMARY OF THE INVENTION

Accordingly, it is a primary object of the present invention to provide a novel method of fabricating a bipolar-CMCS integrated circuit device.

It is a further object of the present invention to provide a novel method of fabricating a bipolar-CMOS integrated circuit device having a bipolar transistor exhibiting an excellent high frequency property.

It is a still further object of the present invention to provide a novel method of fabricating a bipolar-CMOS integrated circuit device having a bipolar transistor including an active base region and an emitter region, both of which are free from any damage provided by an anisotropic etching.

It is a furthermore object of the present invention to provide a novel method of fabricating a bipolar-CMOS integrated circuit device having a resistive region exhibiting a high accuracy resistance value.

It is yet a further object of the present invention to provide a novel method of fabricating a bipolar-CMOS integrated circuit device having a resistive region being free from any damage provided by an anisotropic etching.

It is another object of the present invention to provide a novel bipolar-CMOS integrated circuit device.

It is still another object of the present invention to provide a novel bipolar-CMOS integrated circuit device having a bipolar transistor exhibiting an excellent high frequency property.

It is yet another object of the present invention to provide a novel bipolar-CMOS integrated circuit device having a bipolar transistor including an active base region and an emitter region, both of which are free from any damage provided by an anisotropic etching.

It is also another object of the present invention to provide a novel bipolar-CMOS integrated circuit device having a resistive region exhibiting a high accuracy resistance value.

It is an additional object of the present invention to provide a novel bipolar-CMOS integrated circuit device having a resistive region being free from any damage provided by an anisotropic etching.

The above and other objects, features and advantages of the present invention will be apparent from the following descriptions.

The present invention intends to provide a novel method of fabricating a semiconductor integrated circuit device involving a bipolar transistor having a collector contact with side-wall oxide films. The novel method comprises the following steps. A semiconductor layer of a first conductive type is formed on a semiconductor substrate in which a formation of a buried layer on the semiconductor substrate is followed by a formation of an epitaxial layer on the buried layer. Field oxide films are selectively formed in a surface region of the epitaxial layer. A first collector contact is formed on a predetermined area of the first conductive type semiconductor layer. An active base region of a second conductive type is formed in an exposed surface of the first conductive type semiconductor layer by accomplishing an ion-implantatior of a second conductive type dopant. An oxide film is formed on an entire surface of the device. An anisotropic etching of the oxide film is accomplished by using a photo-resist pattern. As a result, side-wall oxide films are formed at opposite side portions of the first collector contact. Concurrently, an active base region protective oxide film is formed in a predetermined area within the active base region so that the active base region protective oxide film protects the predetermined area in the active base region from any damage such as etching and crystal defects caused by the anisotropic etching. An ion-implantatior of the second conductive type dopant is accomplished by using the active base region protective oxide film and a photo-resist as masks. As a result, a graft base region is formed in the active base region at its part which is not covered with the active base region protective oxide film. Thus, the active base region remains only in the predetermined area which has no damage caused by the etching. An inter-layer insulator is formed on an entire surface of the device. A first emitter contact made of a polycrystalline silicon film doped with the first conductive type dopant so as to be in contact with a part of the active base region. An emitter region is formed in the active base region by a diffusion of the first conductive type dopant from the emitter contact into the active base region. Base, second emitter and second collector contacts are respectively formed in the inter-layer insulator.

The present invention also intends to provide a novel semiconductor integrated circuit device involving a bipolar transistor having a collector contact with side-wall oxide films. The device includes a semiconductor substrate. The device also includes a semiconductor layer of a first conductive type formed on the semiconductor substrate. The device also includes an active base region of a second conductive type formed in a surface region of the first conductive type semiconductor layer. The device also includes a graft base region of the second conductive type formed on a surface region of the first conductive type semiconductor layer except for the active base region. The device also includes an emitter region of the first conductive type formed in a surface region of the active base region. The device also includes active base region protective oxide film covering at least an entire surface of the active base region including the emitter region except for the graft base region. The device also includes a base contact abutting the graft base region, an emitter contact abutting the emitter region and a collector contact abutting a part of the first conductive type semiconductor layer. The collector contact has side-wall oxide films at its opposite side portions. The device also includes an inter-layer insulator covering an entire surface of the device.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

Figure 4:
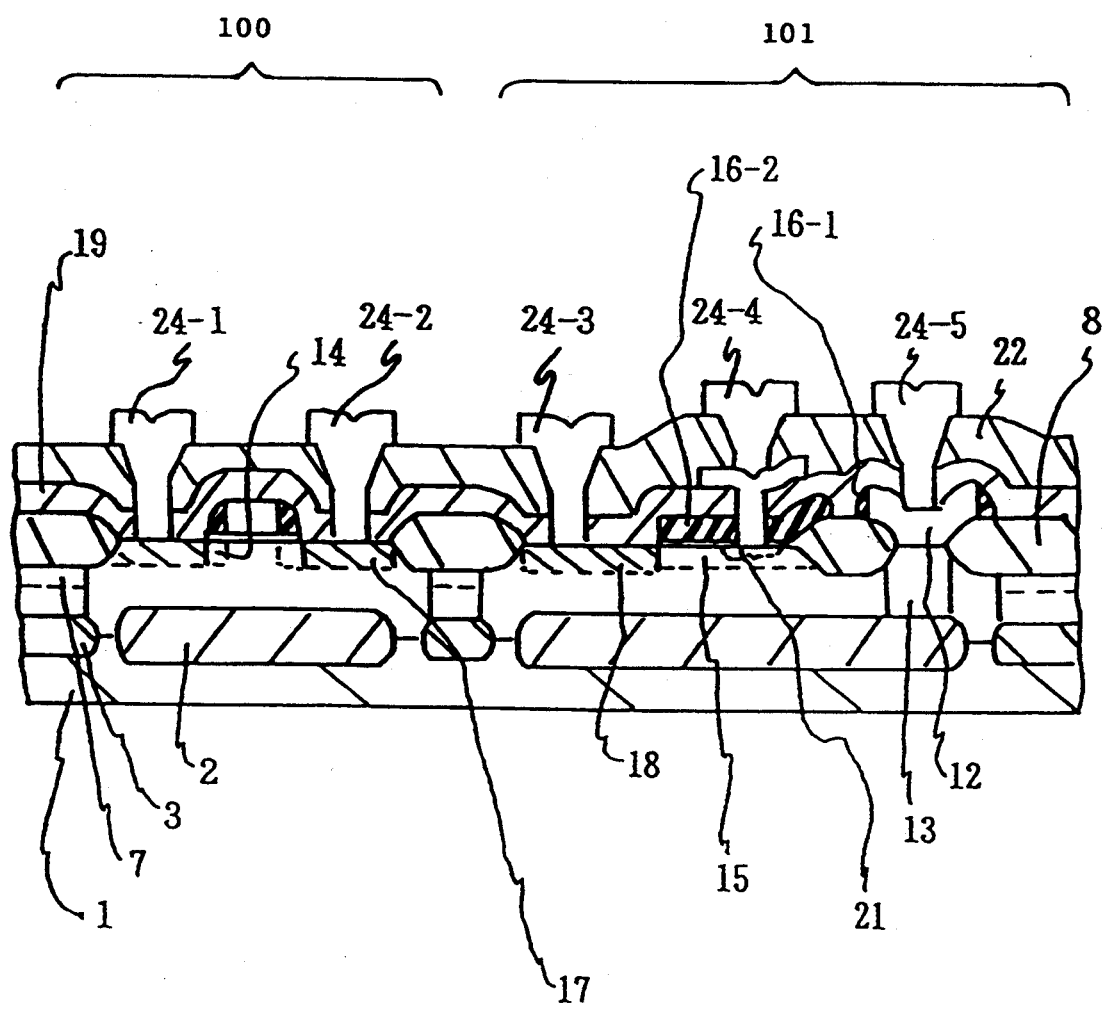
FIG. 4 is a fragmentary cross sectional elevation view illustrative of a part of a structure of a novel Bi-CMOS integrated circuit device except for an n-channel MOS transistor of a first embodiment according to the present invention.

A first embodiment of the present invention will be described with reference to FIGS. 4 and 5.

A structure of a novel Bi-CMOS integrated circuit device will be described with reference to FIG. 4. The structure of the novel Bi-CMOS integrated circuit device is analogous to the structure of the conventional Bi-CMOS integrated circuit device except that an oxide film covers an entire surface of each of a base region and an emitter region.

The novel bipolar-CMOS integrated circuit device includes an n-channel MOS transistor region, a p-channel MOS transistor region 100, a bipolar transistor region 101 and a resistive region. In FIG. 4, both the illustration of the n-channel MOS transistor and the resistive region are omitted.

The novel bi-CMOS integrated circuit device has a semiconductor substrate 1. A plurality of n-type buried layers 2 doped with an n-type dopant are formed on the semiconductor substrate 1 in each of the p-channel type MOS transistor region 100 and the bipolar transistor region 101. Further, a p-type buried layer 3 doped with a p-type dopant is formed on the semiconductor substrate 1 at a boundary area between the p-channel MOS transistor region 100 and the bipolar transistor region 101. An n-type epitaxial layer is formed on the n-type buried layer 2 in the bipolar transistor region 101. An n-type well region is formed on the n-type buried layer 2 in the p-channel MOS transistor region 100. A p-type well region is formed on the p-type buried layer 3 at the boundary area between the p-channel MOS transistor region 100 and the bipolar transistor region 101. Further, a channel stopper 7 is formed on the p-type well region at the boundary area between the p-channel MOS transistor region 100 and the bipolar transistor region 101. Furthermore, field oxide films 8 serving as isolation films are formed on the channel stopper 7 to isolate between the p-channel MOS transistor region 100 and the bipolar transistor region 101.

In the p-channel MOS transistor region 100, source and drain regions doped with a p-type dopant are formed at upper portions of the n-type well region thereby defining p-type channel region. A gate oxide film is formed on the channel region. A gate contact is formed on the gate oxide film. Side-wall oxide films are formed at opposite side portions of the gate contact.

A first inter-layer insulator 19 is formed on the entire surface of the device. A second inter-layer insulator 20 is further formed on the first inter-layer insulator 19. Source and drain contacts 24-1 and 24-2 are so formed as to be in contact with the source and drain regions 17 respectively.

In the bipolar transistor region 101, an n+-type low resistive buried layer 13 is formed directly under a collector contact region. A collector contact 24-5 is formed on the n+-type low resistive buried layer. The existence of the n+-type low resistive buried layer makes a collector resistance reduced as its high dopant concentration thereby permitting the bipolar transistor to exhibit high frequency and high speed properties. Side-wall oxide films 61-1 are formed at opposite side portions of the collector contact. A p-type base region 15 and a graft base region 18 are formed at upper portions of the n-type epitaxial layer 4. A base contact 24-3 is so formed as to be in contact with the graft base region 18. An emitter region 21 is formed in an upper portion of the base region 15. An emitter contact 24-4 is so formed as to be in contact with the emitter region 21. A performance of the bipolar transistor depends upon the base region 15 but for the graft base region 18. The graft base region 18 has a higher dopant concentration than a dopant concentration of the active base region as being independent from a device performance, thereby making a base resistance reduced. Further, an oxide film 16-2 is so formed as to overlay the emitter region 21 and the base region 15, but for the graft base region 18. An edge portion of the oxide film 16-2 exists directly over a boundary line between the graft base region 18 and the base region 15. The oxide film 16-2 covers an entire surface of the base region 15. Thus, the base region 15 has no potion which does not underlay the oxide film 16-2.

The fabrication processes of the bipolar-CMOS integrated circuit device of the first embodiment according to the present invention will be described in reference to FIGS. 4 and 5.

The semiconductor substrate 1 is prepared, after which n-type buried layers 2 doped with an n-type dopant are formed by a normal process on the semiconductor substrate 1 in each of the p-channel type MOS transistor region 100 and the bipolar transistor region 101. Further, the p-type buried layer 3 doped with a p-type dopant is formed by a normal process on the semiconductor substrate 1 at a boundary area between the p-channel MOS transistor region 100 and the bipolar transistor region 101. The n-type epitaxial layer is formed by a normal process on the n-type buried layer 2 in the bipolar transistor region 101. The n-type well region is formed on the n-type buried layer 2 in the p-channel MOS transistor region 100. A p-type well region 5 is formed on the p-type buried layer 3. Further, the channel stopper 7 is formed on the p-type well region 100. Furthermore, field oxide films 8 serving as isolation films are formed on the channel stopper 7 to isolate between the p-channel MOS transistor region 100 and the bipolar transistor region 101.

Subsequently, a thin oxide film 9 having a thickness in the range from 150 angstroms to 400 angstroms is formed on each of the p-channel MOS transistor region 100 and the bipolar transistor region 101 in addition to a collector contact region. The above processes are normal processes which are well known in the art. After a selective removal of a portion of the thin oxide film 9 in the collector contact region, a polycrystalline silicon film doped with an n-type dopant at a high dopant concentration is so selectively formed as to remain at a gate contact region and a collector contact region. A portion of the polycrystalline silicon film remains in the collector contact region thereby resulting in a formation of the collector contact. An n+-type buried layer 13 is formed by a diffusion of an n-type dopant from the collector contact 12 into the n-type epitaxial layer. Thus, the collector contact 12 is in contact with the n+type buried layer 13. The n+-type buried layer having a high dopant concentration is able to make the collector contact reduced. This permits the bipolar transistor to exhibit a high frequency performance. In contrast, a portion of the polycrystalline silicon film remains in the gate contact region serves as a gate contact.

Figure 1:
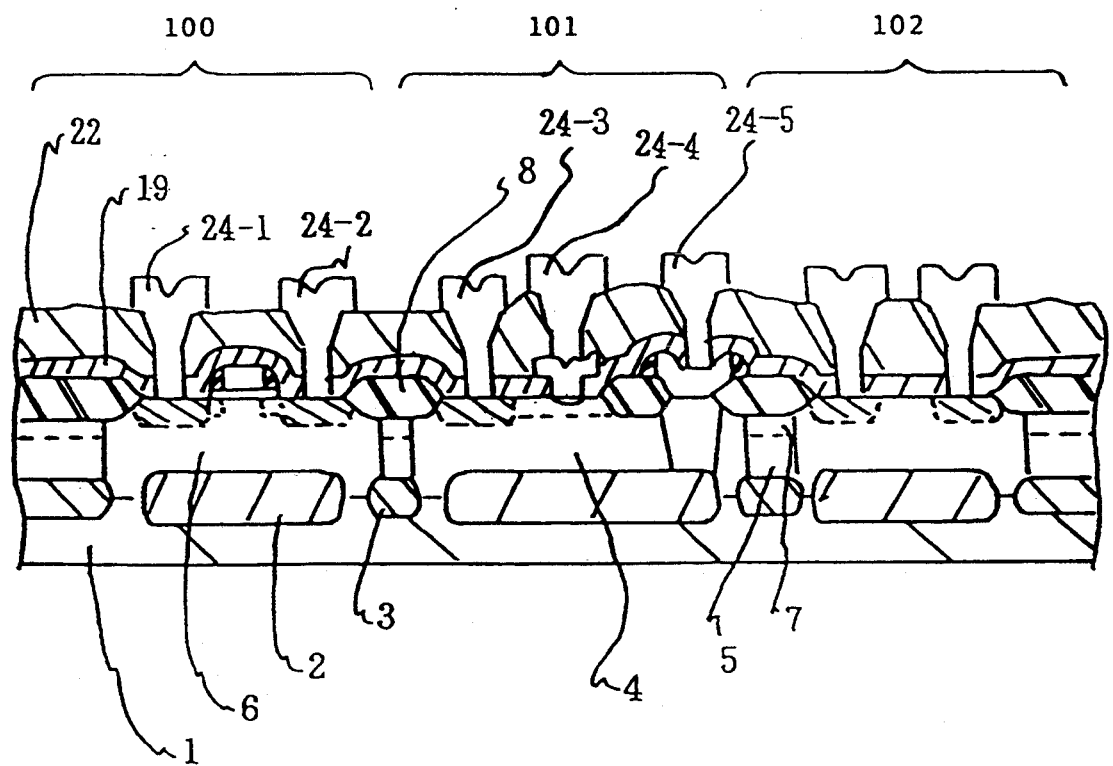
FIG. 1 is a fragmentary cross sectional elevation view illustrative of a part of a structure of the conventional Bi-CMOS integrated circuit device except for an n-channel MOS transistor.
Figure 2A:
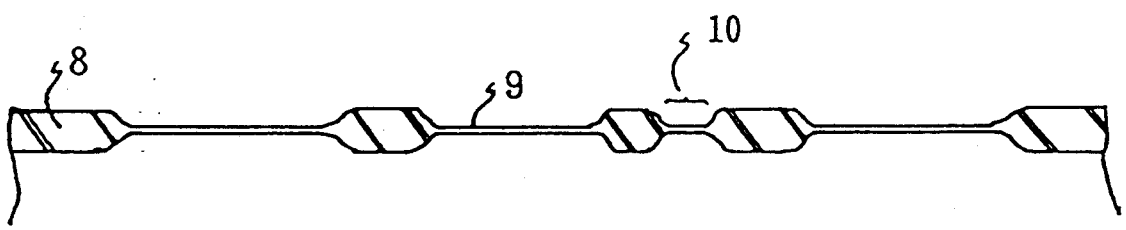
FIGS. 2A to 2D are fragmentary cross sectional elevation views illustrative of sequential steps involved in the conventional fabrication method of the Bi-CMOS integrated circuit device.
Figure 2B:
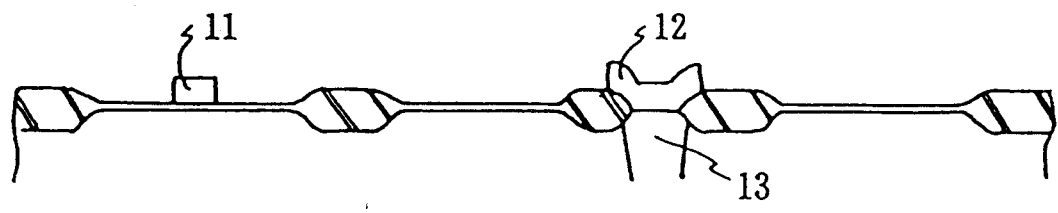
Figure 2C:
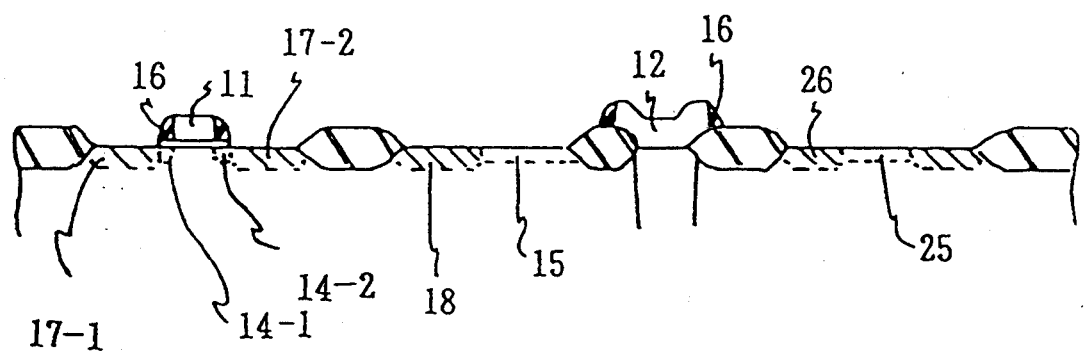
Figure 2D:
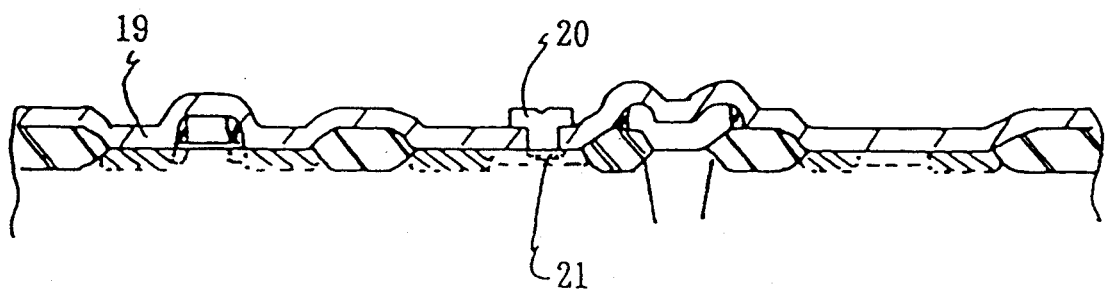
Figure 3A:
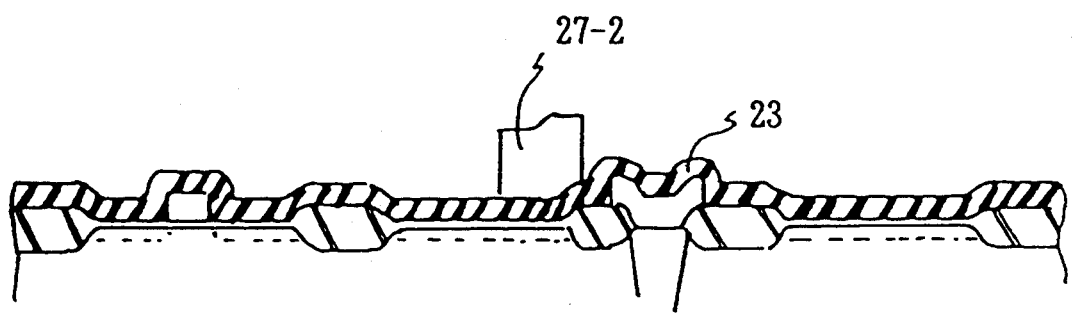
FIGS. 3A to 3C are fragmentary cross sectional elevation views illustrative of sequential steps involved in the another conventional fabrication method of the Bi-CMOS integrated circuit device.
Figure 3B:
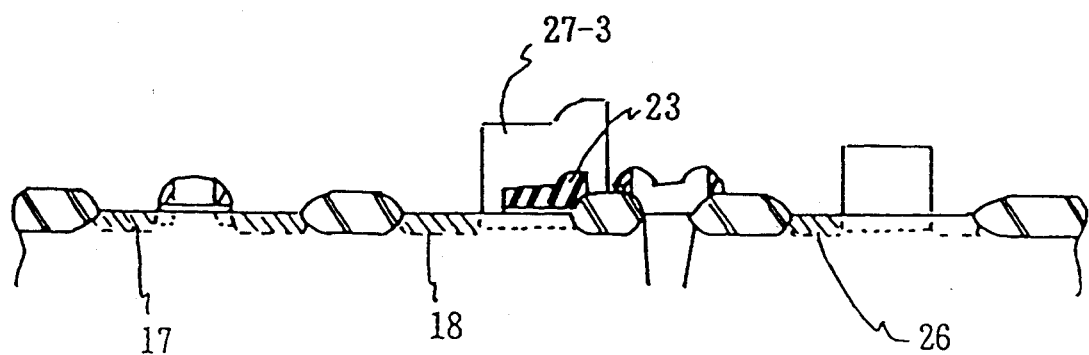
Figure 3C:
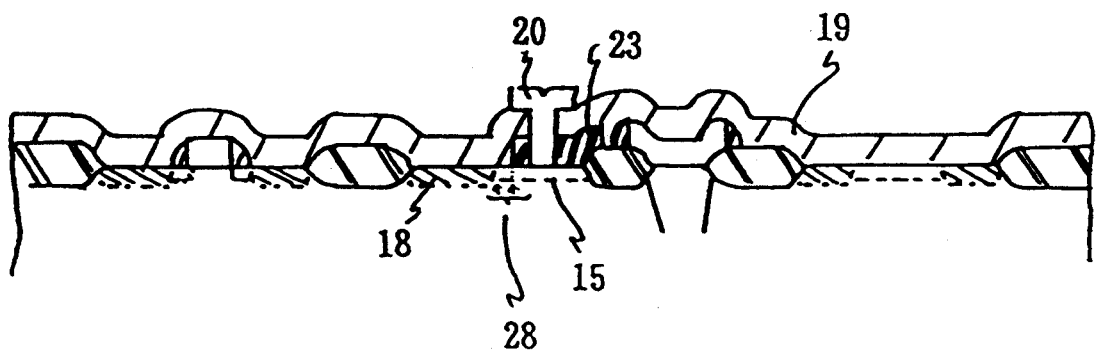

Further, a selective ion-implantation of an n-type dopant into an n-channel MOS transistor region is accomplished at a dopant concentration in the range from $1 \times 10^{17}$ atoms/cm$^3$ to $5 \times 10^{18}$ atoms/cm$^3$. Also, a selective ion-implantation of but a p-type dopant into the p-channel MOS transistor region 100 is accomplished at a dopant concentration in the range from $5 \times 10^{17}$ atoms/cm$^3$ to $2 \times 10^{18}$ atoms/cm$^3$. As a result, p-type source and drain regions 14-1 and 14-2 having a relatively low dopant concentration are formed in the n-type well region formed in the p-channel MOS transistor region 100 thereby defining the channel region under the gate contact 11. Further, the p-type base region 15 having a relatively low dopant concentration is also formed in an upper portion of the n-type epitaxial layer formed in the bipolar transistor region 101. Although the above fabrication processes are analogous to that of the prior art as illustrated in FIGS. 2A to 2B, the following processes of the first embodiment are completely different from that of the prior art.

Figure 5:
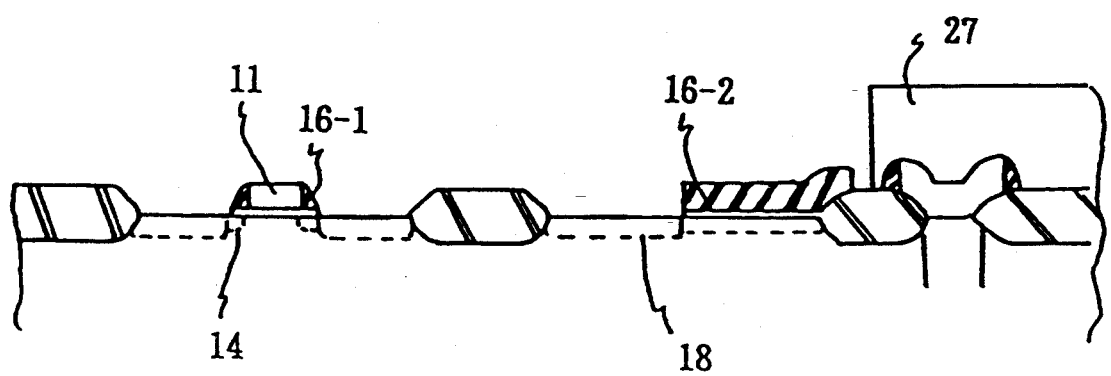
FIG. 5 is a fragmentary cross sectional elevation view illustrative of one step involved in a novel fabrication method of a Bi-CMOS integrated circuit device of a first embodiment according to the present invention.

As illustrated in FIG. 5, an oxide film 16 having a thickness in the range from 100 nanometers to 300 nanometers is formed by a vapor phase growth method on an entire surface of the device, and thus on the p-channel MOS transistor region 100 and the bipolar transistor region 101. After that, an anisotropic etching to the vapor phase growth oxide film 16 is accomplished by using a photo-resist 27 which is selectively formed. Although FIG. 5 illustrates only a part of the photo-resist 27 in the vicinity of the collector contact 12 in the bipolar transistor region 101, the photo-resist is provided on the following remaining portions of the vapor phase growth oxide film 16. As a result, the vapor phase growth oxide film 16 remains at opposite side portions of the gate contact 11 thereby resulting in a formation of side-wall oxide films 16-1. The vapor phase growth oxide film 16 also remains at opposite side portions of the collector contact 12 thereby resulting in a formation of side-wall oxide films. The vapor phase growth oxide film 16 further remains on a predetermined region including a base region and an emitter region, except for a graft base region, each of which will be formed.

Subsequently, an ion-implantation of a p-type dopant such as boron into both the p-channel MOS transistor region 100 and the bipolar transistor region 101 is accomplished at a dopant concentration of approximately $1 \times 10^{18}$ to approximately $1 \times 10^{20}$ atoms/cm$^3$. In the p-channel MOS transistor region 100, the ion-implantation of the p-type dopant is accomplished by using both the gate contact 11 and the side-wall films 16-1 as a mask so that p-type source and drain regions 17 having a high dopant concentration are formed in an upper portion of the n-type well region. In the bipolar transistor region 101, the above ion-implantation of the p-type dopant is accomplished by using the remaining portion 16-2 of the vapor phase growth oxide film 16 as a mask. As a result, the graft base region 18 is formed in a portion of the active base region 15, which does not underlay the remaining portion 16-2 of the vapor phase growth oxide film 16. Thus, an edge portion of the remaining vapor phase growth oxide film 16-2 both exists directly over and defines a boundary line between the graft base region 18 and the active base region 15. While the graft base region 18 does not underlay the remaining vapor phase oxide film 16-2, the base region 15 is completely covered with the remaining vapor phase growth oxide film 16-2.

Accordingly, the base region 15 includes no portion which is damaged by the anisotropic etching to the vapor phase growth oxide film, which is important for the bipolar transistor reliability. Such base region 15 is free from that its surface is etched by the anisotropic etching to the vapor phase growth oxide film. This allows the base region 15 to have a predetermined thickness. Such base region 15 is also free from including any crystal defect caused by the anisotropic etching to the vapor phase growth oxide film. Further, since an emitter region will hereinafter be formed in an upper portion of the base region 15, an emitter region is also free from having any etched surface portion or any crystal defect. Such base region 15 including no damaged portion and thus no etched surface portion and no crystal defect keeps the base-emitter junction from being broken. Such base region 15 having no etched surface portion also keeps the base resistance from being increased.

In contrast, the graft base region 18 having a high dopant concentration serves to make the base resistance lowered in addition to make the base contact resistance depending upon a metal-semiconductor contact. The performance of the bipolar transistor is independent from the graft base region, since the graft base region 18 does not underlay the emitter region.

After the above p-type dopant ion-implantation process, a first inter-layer insulator 19 having a thickness in the range from 150 nanometers to 300 nanometers is formed by a vapor phase growth method on an entire surface of the device. After that, an opening is selectively formed in the first inter-layer insulator 19 over the base region 15. A second polycrystalline silicon film doped with an n-type dopant is selectively formed in the vicinity of the opening so as to be in contact with the p-type base region 15, followed by a diffusion of the n-type dopant from the second polycrystalline silicon film into the active base region. As a result, the n-type emitter region 21 is formed at an upper portion of the base region 15.

A second inter-layer insulator 22 having a thickness in the range from 300 nanometers to 700 nanometers is formed on an entire surface of the device, followed by a selective formation of openings. Further, a metal film made of a metal having a low conductivity such as aluminum is so formed on the second inter-layer insulator 22 as to cover the openings formed in the second inter-layer insulator 22. Namely, the openings formed in the second inter-layer insulator 22 are respectively filled with the metal film. The metal film is so patterned as to remain in the vicinity of the respective openings. The remaining portions of the metal film serve as respective contacts, and thus the source and drain contacts 24-1 and 24-2 in the p-channel MOS transistor region 100 and the base, emitter and collector contacts 24-3, 24-4 and 24-5 in the bipolar transistor region 101. The bipolar-CMOS integrated circuit device has been formed by such processes.

Advantages provided by the novel fabrication method of the first embodiment of the present invention will be described. When accomplishing the anisotropic etching to the vapor phase growth oxide film, the base region 15 is completely covered and protected by the photo-resist existing on the remaining portion 16-2 of the vapor phase growth oxide film 16. Then, the base region 15 is subjected to no damage by the anisotropic etching. Accordingly, the base region 15 includes no active portion which is damaged by the anisotropic etching to the vapor phase growth oxide film, although the above prior art is not so. Such base region 15 having no active base region is free from that its surface is etched by the anisotropic etching to the vapor phase growth oxide film. This allows the base region 15 to have a predetermined thickness. Such base region 15 is also free from including any crystal defect caused by the anisotropic etching to the vapor phase growth oxide film. Further, since the emitter region 21 is formed in an upper portion of the base region 15, the emitter region 21 is also free from having any etched surface portion or any crystal defect. Such novel fabrication method of the first embodiment keeps the base-emitter junction from being broken. Such base region 15 having no etched surface portion also keeps the base resistance from being increased. Those permits the bipolar transistor to exhibit excellent high frequency and high speed performances. Then, the yield of the Bi-CMOS integrated circuit device is also improved considerably.

Figure 6:
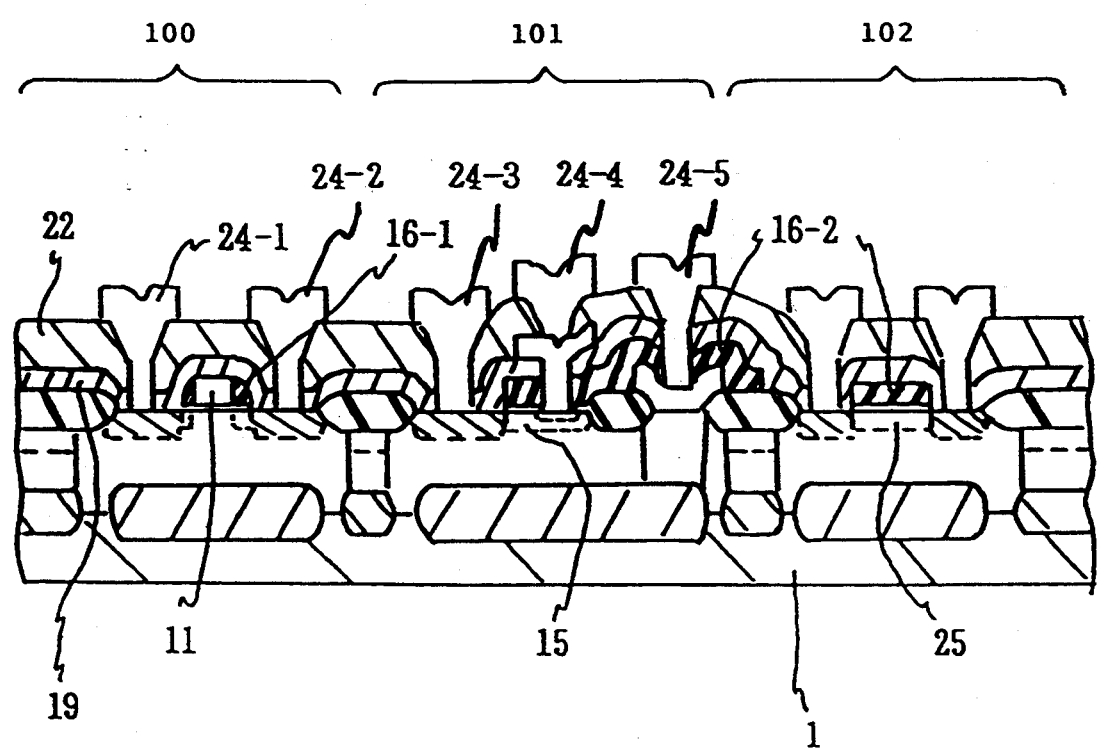
FIG. 6 is a fragmentary cross sectional elevation view illustrative of a part of a structure of a novel Bi-CMOS integrated circuit device except for an n-channel MOS transistor of a second embodiment according to the present invention.

A second embodiment of the present invention will be described with reference to FIGS. 6 and 7A to 7B.

A structure of a novel Bi-CMOS integrated circuit device will be described with reference to FIG. 6. The structure of the novel Bi-CMOS integrated circuit device of the second embodiment is analogous to that of the first embodiment except that an oxide film is formed by a plasma vapor phase growth method or a reduced pressure vapor phase growth method. An additional difference in the structure from the first embodiment is that a vapor phase growth oxide film covers an entire surface of the bipolar transistor region but for a graft base region. Namely, the vapor phase growth oxide film covers not only an active base region but also a collector contact.

The novel bipolar-CMOS integrated circuit device includes an n-channel MOS transistor region, a p-channel MOS transistor region 100, a bipolar transistor region 101 and a resistive region 102. In FIG. 6, the illustration of the n-channel MOS transistor is omitted.

The novel bi-CMOS integrated circuit device has a semiconductor substrate 1. A plurality of n-type buried layers 2 doped with an n-type dopant are formed on the semiconductor substrate 1 in each of the p-channel type MOS transistor region 100, the bipolar transistor region 101 and the resistive region 102. Further, a p-type buried layer 3 doped with a p-type dopant is formed on the semiconductor substrate 1 at boundary areas both between the p-channel MOS transistor region 100 and the bipolar transistor region 101 and between the bipolar transistor region 101 and the resistive region 102. An n-type epitaxial layer is formed on the n-type buried layer 2 in the bipolar transistor region 101. An n-type well region is formed on the n-type buried layer 2 in the p-channel MOS transistor region 100. Each of p-type well regions is formed on the p-type buried layer 3 at the boundary areas both between the p-channel MOS transistor region 100 and the bipolar transistor region 101 and between the bipolar transistor region 101 and the resistive region 102. Further, a channel stopper is formed on the p-type well region at the boundary areas both between the p-channel MOS transistor region 100 and the bipolar transistor region 101 and between the bipolar transistor region 101 and the resistive region 102. Furthermore, field oxide films serving as isolation films are formed on the channel stoppers to both isolate between the p-channel MOS transistor region 100 and the bipolar transistor region 101 and isolate between the bipolar transistor region 101 and the resistive region 102.

In the p-channel MOS transistor region 100, source and drain regions doped with a p-type dopant are formed at upper portions of the n-type well region thereby defining p-type channel region. A gate oxide film is formed on the channel region. A gate contact 11 is formed on the gate oxide film. Side-wall oxide films are formed at opposite side portions of the gate contact 11.

A first inter-layer insulator 19 is formed on the entire surface of the device. A second inter-layer insulator is further formed on the first inter-layer insulator 19. Source and drain contacts 24-1 and 24-2 are so formed as to be in contact with the source and drain regions respectively.

In the bipolar transistor region 101, an n+-type low resistive buried layer is formed directly under a collector contact region. A collector contact 24-5 is formed on the n+-type low resistive buried layer. The existence of the n+-type low resistive buried layer makes a collector resistance reduced as its high dopant concentration thereby permitting the bipolar transistor to exhibit high frequency and high speed properties. A p-type base region 15 and a graft base region 18 are formed at upper portions of the n-type epitaxial layer 4. A base contact 24-3 is so formed as to be in contact with the graft base region 18. An emitter region 21 is formed in an upper portion of the base region 15. An emitter contact 24-4 is so formed as to be in contact with the emitter region 21. A bipolar transistor performance depends upon the base region 15 but for the graft base region 18. The graft base region 18 has a higher dopant concentration than a dopant concentration of the base region 15 as being independent from a device performance, thereby making a base resistance reduced. Further, an oxide film 16-2 is so formed as to overlay an entire surface of the bipolar transistor region 101 but for the graft base region 18. Namely, the oxide film 16-2 covers the emitter region 21 and the base region 15, in addition the collector contact 12 and a part of the field oxide film existing at the boundary area between the bipolar transistor region 101 and the resistive region 102. But, the oxide film 16-2 does not overlay the graft base region 18. An edge portion of the oxide film 16-2 both defines and exists directly over a boundary line between the graft base region 18 and the active base region 15.

In the resistive region 102, low resistive regions which are doped with a p-type dopant are formed at upper portions of the n-type well region on the n-type buried layer. Contact plugs are formed on the low resistive region. The p-type low resistive regions have a high dopant concentration so as to make the contact resistance reduced. An active resistive region 25 is formed between the low resistive regions. The active resistive region 25 has a lower dopant concentration than that of the low resistive regions. A thin oxide film overlays the active resistive region 25. The oxide film 16-2 also covers the active resistive region 25 through the thin oxide film.

The fabrication processes of the bipolar-CMOS integrated circuit device of the second embodiment according to the present invention will be described in reference to FIGS. 6 and 7A to 7B.

The semiconductor substrate 1 is prepared, after which n-type buried layers 2 doped with an n-type dopant are formed by a normal process on the semiconductor substrate 1 in each of the p-channel type MOS transistor region 100, the bipolar transistor region 101 and the resistive region 102. Further, the p-type buried layer doped with a p-type dopant is formed by a normal process on the semiconductor substrate 1 at boundary areas both between the p-channel MOS transistor region 100 and the bipolar transistor region 101 and between the bipolar transistor region 101 and the resistive region 102. The n-type epitaxial layer is formed by a normal process on the n-type buried layer in the bipolar transistor region 101. The n-type well region is formed on the n-type buried layer in the p-channel MOS transistor region 100. Each of p-type well regions is formed on each of the p-type buried layers. Further, the channel stoppers are formed on the p-type well region. Furthermore, field oxide films 8 serving as isolation films are formed on the channel stoppers to both isolate between the p-channel MOS transistor region 100 and the bipolar transistor region 101 and isolate between the bipolar transistor region 101 and the resistive region 102.

Subsequently, a thin oxide film having a thickness in the range from 150 angstroms to 400 angstroms is formed on each of the p-channel MOS transistor region 100 and the bipolar transistor region 101 in addition to a collector contact region. The above processes are normal processes which are well known in the art. After a selective removal of a portion of the thin oxide film 9 in the collector contact region, a polycrystalline silicon film doped with an n-type dopant at a high dopant concentration is so selectively formed as to remain at both a gate contact region and a collector contact region. A portion of the polycrystalline silicon film remains in the collector contact region thereby resulting in a formation of the collector contact 12. An n+-type buried layer 13 is formed by a diffusion of an n-type dopant from the collector contact 12 into the n-type epitaxtial layer. Thus, the collector contact 12 is in contact with the n+-type buried layer 13. The n+-type buried layer having a high dopant concentration is able to make the collector contact reduced. This permits the bipolar transistor to exhibit a high frequency performance. In contrast, a portion of the polycrystalline silicon film remains in the gate contact region serves as a gate contact.

Further, a selective ion-implantation of an n-type dopant into an n-channel MOS transistor region is accomplished at a dopant concentration in the range from $1 \times 10^{17}$ atoms/cm$^3$ to $5 \times 10^{18}$ atoms/cm$^3$. Also, a selective ion-implantation of but a p-type dopant into the p-channel MOS transistor region 100 is accomplished at a dopant concentration in the range from $5 \times 10^{17}$ atoms/cm$^3$ to $2 \times 10^{18}$ atoms/cm$^3$. As a result, p-type source and drain regions 14-1 and 14-2 having a relatively low dopant concentration are formed in the n-type well region formed in the p-channel MOS transistor region 100 thereby defining the channel region under the gate contact 11. Further, the p-type active base region 15 having a relatively low dopant concentration is also formed in an upper portion of the n-type epitaxial layer formed in the bipolar transistor region 101. Although the above fabrication processes are the same as that of the first embodiment as illustrated in FIGS. 4 and 5, the following processes of the second embodiment are different from that of the first embodiment.

Figure 7A:
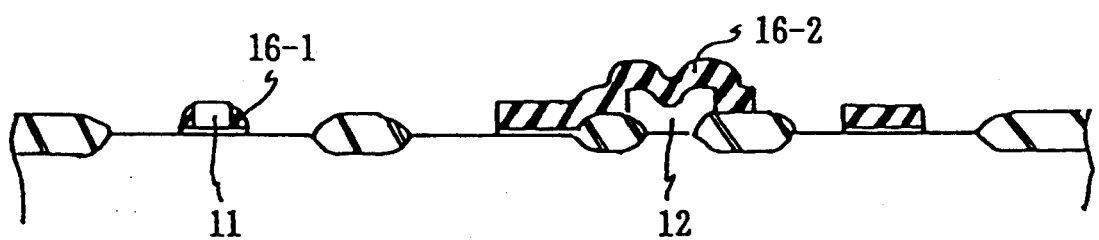
FIGS. 7A to 7B are fragmentary cross sectional elevation views illustrative of sequential steps involved in a novel fabrication method of a Bi-CMOS integrated circuit device of a second embodiment according to the present invention.
Figure 7B:
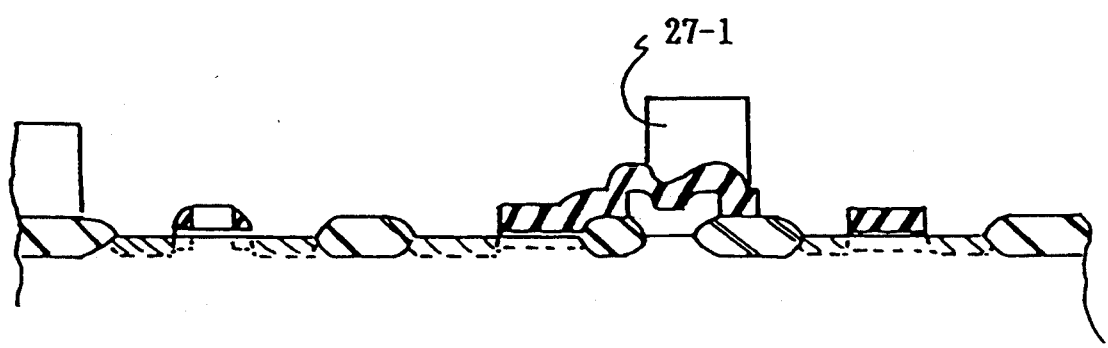

As illustrated in FIG. 7A, an oxide film 16 having a thickness in the range from 100 nanometers to 300 nanometers is formed by either a plasma vapor phase growth method or a reduced pressure vapor phase growth method on an entire surface of the device, and thus on the p-channel MOS transistor region 100, the bipolar transistor region 101 and the resistive region 102. After that, an anisotropic etching to the vapor phase growth oxide film 16 is accomplished by using a photo-resist 27 which is selectively formed. Although FIG. 7A does not illustrate the photo-resist, the photo-resist is provided on the following remaining portions of the vapor phase growth oxide film 16. As a result, the vapor phase growth oxide film 16 remains at opposite side portions of the gate contact 11 thereby resulting in a formation of side-wall oxide films 16-1. The plasma vapor phase growth method and the reduced pressure vapor phase growth method are able to make the coating resistivity of the side-wall oxide films 16-1 existing at the opposite side portions of the gate contact 11 be improved. The vapor phase growth oxide film 16 also remains on the entire surface of the device in the bipolar transistor region 101 except for the graft base region 18 thereby resulting in a formation of the vapor phase growth oxide film 16-2. As a result, the remaining portion 16-2 of the vapor phase growth oxide film 16 overlays the active base region 15, the collector contact 12 and its adjacent portion. In the resistive region 102, the vapor phase growth oxide film 16 further remains on a predetermined portion on which an active resistive region will be formed.

Subsequently, an ion-implantation of a p-type dopant such as boron into both the p-channel MOS transistor region 100, the bipolar transistor region 101 and the resistive region 102 is accomplished at a dopant concentration of approximately $1 \times 10^{18}$ to approximately $1 \times 10^{20}$ atoms/cm$^3$. In the p-channel MOS transistor region 100, the ion-implantation of the p-type dopant is accomplished by using both the gate contact 11 and the side-wall films 16-1 as a mask so that p-type source and drain regions 17 having a high dopant concentration are formed in an upper portion of the n-type well region.

In the bipolar transistor region 101, the above ion-implantation of the p-type dopant is accomplished by using the remaining portion 16-2 of the vapor phase growth oxide film 16 as a mask. As a result, the graft base region 18 is formed in a portion of the active base region 15, which does not underlay the remaining portion 16-2 of the vapor phase growth oxide film 16. Thus, an edge portion of the remaining vapor phase growth oxide film 16-2 both exists directly over and defines a boundary line between the graft base region 18 and the base region 15. While the graft base region 18 does not underlay the remaining vapor phase oxide film 16-2, the base region 15 is completely covered with the remaining vapor phase growth oxide film 16-2.

Accordingly, the base region 15 includes no portion which is damaged by the anisotropic etching to the vapor phase growth oxide film, which is important for the bipolar transistor reliability. Such base region 15 is free from that its surface is etched by the anisotropic etching to the vapor phase growth oxide film. This allows the base region 15 to have a predetermined thickness. Such base region 15 is also free from including any crystal defect caused by the anisotropic etching to the vapor phase growth oxide film. Further, since an emitter region will hereinafter be formed in an upper portion of the base region 15, an emitter region is also free from having any etched surface portion or any crystal defect. Such base region 15 including no damaged portion and thus no etched surface portion and no crystal defect keeps the base-emitter junction from being broken. Such base region 15 having no etched surface portion also keeps the base resistance from being increased.

In contrast, the graft base region 18 having a high dopant concentration serves to make the base resistance lowered in addition to make the base contact resistance lowered depending upon a metal-semiconductor contact. The performance of the bipolar transistor is independent from the graft base region 18, since the graft base region 18 does not underlay the emitter region.

Furthermore, in the bipolar transistor region 101, the collector contact 12 made of the polycrystalline silicon film which is doped with the n-type dopant is completely covered with the remaining portion 16-2 of the vapor phase growth oxide film 16. Even if the photo-resist 27-1 covers but only a part of the collector contact 12 as illustrated in FIG. 7B, the remaining portion 16-2 of the vapor phase growth oxide film 16 covering the collector contact 12 keeps the p-type dopant from being implanted into the collector contact 12 made of n-type polycrystalline silicon film. The existence of the remaining portion 16-2 of the vapor phase growth oxide film 16 covering the entire of the collector contact 12 prevents an inferior accuracy of the alignment of the photo-resist 27-1 to cause the ion-implantation of the p-type dopant into the n-type collector contact 12. This also improves the yield of the Bi-CMOS integrated circuit device.

In the resistive region 102, the ion-implantation of the p-type dopant into the resistive region 102 is accomplished by using the remaining portion 16-2 of the vapor phase growth oxide film 16 existing on the predetermined area as a mask. As a result, low resistive regions are formed in an upper portion of the n-type well region in the resistive region 102. The low resistive regions have a higher dopant concentration than that of the active resistive region 25. The low resistive region serves to make the contact plug resistance reduced. Opposite edge portions of the remaining portion 16-2 of the vapor phase growth oxide film 16 both defines and exists directly over boundary lines between the active resistive region 25 and the low resistive regions. The remaining portion 16-2 of the vapor phase growth oxide film 16 is able to prevent the active resistive region 25 to be damaged by the anisotropic etching as covering the active resistive region 25. Namely, the active resistive region 25 is free from being etched by the anisotropic etching. Further, the active resistive region 25 is also free from including any crystal defect caused by the anisotropic etching. The existence of the remaining vapor phase growth oxide film 16-2 on the active resistive region 25 permits the resistive region 102 to possess a stable resistance value.

After the above p-type dopant ion-implantation process, a first inter-layer insulator 19 having a thickness in the range from 150 nanometers to 300 nanometers is formed by a vapor phase growth method on an entire surface of the device. After that, an opening is selectively formed in the first inter-layer insulator 19 over the active base region 15. A second polycrystalline silicon film doped with an n-type dopant is selectively formed in the vicinity of the opening so as to be in contact with the p-type active base region 15, followed by a diffusion of the n-type dopant from the second polycrystalline silicon film into the active base region 15. As a result, the n-type emitter region 21 is formed at an upper portion of the active base region 15.

A second inter-layer insulator 22 having a thickness in the range from 300 nanometers to 700 nanometers is formed on an entire surface of the device, followed by a selective formation of openings. Further, a metal film made of a metal having a low conductivity such as aluminium is so formed on the second inter-layer insulator 22 as to cover the openings formed in the second inter-layer insulator 22. Namely, the openings formed in the second inter-layer insulator 22 are respectively filled with the metal film. The metal film is so patterned as to remain in the vicinity of the respective openings. The remaining portions of the metal film serve as respective contacts, and thus the source and drain contacts 24-1 and 24-2 in the p-channel MOS transistor region 100 and the base, emitter and collector contacts 24-3, 24-4 and 24-5 in the bipolar transistor region 101, in addition contacts in the resistive region 102. The bipolar-CMOS integrated circuit device has been formed by such processes.

Advantages provided by the novel fabrication method of the second embodiment of the present invention will be described. When accomplishing the anisotropic etching to the vapor phase growth oxide film, the base region 15 is completely covered and protected by the photo-resist existing on the remaining portion 16-2 of the vapor phase growth oxide film 16. Then, the base region 15 is subjected to no damage by the anisotropic etching. Accordingly, the base region 15 includes no active portion which is damaged by the anisotropic etching to the vapor phase growth oxide film, although the above prior art is not so. Such base region 15 having no active base region is free from that its surface is etched by the anisotropic etching to the vapor phase growth oxide film. This allows the base region 15 to have a predetermined thickness. Such base region 15 is also free from including any crystal defect caused by the anisotropic etching to the vapor phase growth oxide film. Further, since the emitter region 21 is formed in an upper portion of the base region 15, the emitter region 21 is also free from having any etched surface portion or any crystal defect. Such novel fabrication method of the second embodiment keeps the base-emitter junction from being broken. Such base region 15 having no etched surface portion also keeps the base resistance from being increased. Those permits the bipolar transistor to exhibit excellent high frequency and high speed performances. Then, the yield of the Bi-CMOS integrated circuit device is also improved considerably.

Furthermore, the novel fabrication method of the first embodiment provides the following additional advantages, although those can not be obtained in the first embodiment. The plasma vapor phase growth method and the reduced pressure vapor phase growth method are able to make the coating resistivity of the side-wall oxide films 16-1 existing at the opposite side portions of the gate contact 11 be improved.

In the bipolar transistor region 101, the collector contact 12 made of the polycrystalline silicon film which is doped with the n-type dopant is completely covered with the remaining portion 16-2 of the vapor phase growth oxide film 16. Even if the photo-resist 27-1 covers but only a part of the collector contact 12, the remaining portion 16-2 of the vapor phase growth oxide film 16 covering the collector contact 12 keeps the p-type dopant from being implanted into the collector contact 12 made of n-type polycrystalline silicon film. The existence of the remaining portion 16-2 of the vapor phase growth oxide film 16 covering the entire of the collector contact 12 prevents an inferior accuracy of the alignment of the photo-resist 27-1 to cause the ion-implantation of the p-type dopant into the n-type collector contact 12. This permits the collector contact to secure a stable collector resistance. This further allows the bipolar transistor to exhibit excellent high frequency and high speed performances. This furthermore improves the yield of the Bi-CMOS integrated circuit device. Additionally, as described above since the novel fabrication method of the second embodiment is free from the above disadvantage in an inferior accuracy of the alignment of the photo-resist pattern, a much higher integration of the Bi-CMOS integrated circuit device is realized.

In the resistive region 102, the remaining portion 16-2 of the vapor phase growth oxide film 16 is able to prevent the active resistive region 25 to be damaged by the anisotropic etching as covering the active resistive region 25. Namely, the active resistive region 25 is free from being etched by the anisotropic etching. Further, the active resistive region 25 is also free from including any crystal defect caused by the anisotropic etching. The existence of the remaining vapor phase growth oxide film 16-2 on the active resistive region 25 permits the resistive region 102 to possess a stable resistance value.

Although in the above first and second embodiments the novel fabrication methods of the present invention were applied to the fabrication processes of the Bi-CMOS integrated circuit device, the present invention is by no means intended to be applied to but only the Bi-CMOS integrated circuit device. Thus, the present invention is also intended to be applied to other semiconductor devices including a bipolar transistor such as bipolar transistors, Bi-MOS transistors and the like.

Whereas modifications of the present invention will no doubt be apparent to a person of ordinary skill in the art, it is to be understood that the embodiments shown and described by way of illustration are by no means intended to be considered in a limiting sense. Accordingly, it is to be intended by claims to cover all modifications of the invention which fall within the sprit and scope of the invention.

What is claimed is:

1. A method of fabricating a semiconductor integrated circuit device involving a bipolar transistor, said method comprising the steps of:

forming a semiconductor layer of a first conductive type on a semiconductor substrate;

forming selectively field oxide films in a surface region of said first conductive type layer;

forming a first collector contact on a first area of said first conductive type semiconductor layer;

forming an active base region of a second conductive type in an exposed surface of said first conductive type semiconductor layer by accomplishing an ion-implantation of a second conductive type dopant;

forming an oxide film on an entire surface of said device;

forming both side-wall oxide films at opposite side portions of said collector contact and an active base region protective oxide film in a second area within said active base region by accomplishing an etching of said oxide film with using a photo-resist pattern so that said active base region protective oxide film protects said second area in said active base region from any damage caused by said etching;

forming a graft base region in said active base region at its part which is not covered with said active base region protective oxide film by accomplishing an ion-implantation of said second conductive type dopant thereby said active region remains only in said second area which has no damage caused by said etching;

forming an inter-layer insulator on an entire surface of said device;

forming a first emitter contact made of a polycrystalline silicon film doped with said first conductive type dopant so as to be in contact with a part of said active base region; and forming an emitter region in said active base region by a diffusion of said first conductive type dopant from said emitter contact into said active base region; and forming base, second emitter and second collector contacts in said inter-layer insulator.

2. The method as claimed in claim 1, wherein said active base region protective oxide film is formed not only on an entire surface of said active base region but also directly over and in the vicinity of said first collector contact.

3. The method as claimed in claim 2, wherein said ion-implantation for forming said graft base region is accomplished by using said active base region protective oxide film covering said first collector contact as a mask.

4. The method as claimed in claim 1, wherein said ion-implantation for forming said graft base region is accomplished by using both said active base region protective oxide film and a photo-resist covering said first collector contact as masks.

5. The method as claimed in claim 1, wherein said ion-implantation for forming said active base region is accomplished by using a photo-resist covering said collector contact as a mask.

6. The method as claimed in claim 1, wherein said process for forming said first conductive type layer comprises the steps of:

forming a buried layer on said semiconductor substrate; and forming an epitaxtial layer on said buried layer.

7. The method as claimed in claim 1, wherein said etching for forming said side-wall oxide films and said active base region protective oxide film is an anisotropic etching.

8. The method as claimed in claim 1, wherein said oxide film is formed by using a vapor phase growth method.

9. The method as claimed in claim 8, wherein said vapor phase growth method is a plasma vapor phase growth method.

10. The method as claimed in claim 8, wherein said vapor phase growth method is a reduced pressure vapor phase growth method.

* * * * *